(12) United States Patent
Kataoka et al.

(10) Patent No.: US 9,054,236 B2
(45) Date of Patent: Jun. 9, 2015

(54) SOLAR CELL SEALING FILM AND SOLAR CELL USING THE SEALING FILM

(75) Inventors: Hisataka Kataoka, Yokohama (JP); Tetsuro Ikeda, Yokohama (JP); Yoshihiko Inoue, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 0 days.

(21) Appl. No.: 14/000,104

(22) PCT Filed: Feb. 7, 2012

(86) PCT No.: PCT/JP2012/052673
§ 371 (c)(1),
(2), (4) Date: Aug. 16, 2013

(87) PCT Pub. No.: WO2012/114861
PCT Pub. Date: Aug. 30, 2012

(65) Prior Publication Data
US 2013/0324671 A1    Dec. 5, 2013

(30) Foreign Application Priority Data
Feb. 22, 2011 (JP) ................. 2011-035392

(51) Int. Cl.
*C08L 23/08* (2006.01)
*H01L 31/0203* (2014.01)
*C08K 5/5419* (2006.01)
*H01L 31/0216* (2014.01)
*H01L 31/048* (2014.01)
*C08K 5/14* (2006.01)
*C08K 5/5425* (2006.01)

(52) U.S. Cl.
CPC ......... *H01L 31/0203* (2013.01); *C08L 23/0853* (2013.01); *C08L 23/0861* (2013.01); *C08K 5/5419* (2013.01); *C08L 2203/204* (2013.01); *C08L 2203/162* (2013.01); *H01L 31/02167* (2013.01); *C08L 2203/206* (2013.01); *C08L 23/0846* (2013.01); *H01L 31/0481* (2013.01); *Y02E 10/50* (2013.01); *C08K 5/14* (2013.01); *C08K 5/5425* (2013.01)

(58) Field of Classification Search
CPC ............ C08L 23/0846; C08L 23/0853; C08L 23/0861; C08L 2203/162; C08L 2203/204; C08L 2203/206; C08K 5/5419; C08K 5/5425; H01L 31/02167

USPC ................................................ 525/330.3, 342
See application file for complete search history.

(56) References Cited

U.S. PATENT DOCUMENTS

| | | | | |
|---|---|---|---|---|
| 5,756,582 | A * | 5/1998 | Mori | 525/193 |
| 6,596,400 | B1 * | 7/2003 | Friedman et al. | 428/441 |
| 2011/0146758 | A1 * | 6/2011 | Trouilhet et al. | 136/249 |
| 2011/0217542 | A1 | 9/2011 | Moroishi et al. | |

FOREIGN PATENT DOCUMENTS

| | | |
|---|---|---|
| JP | 58-060579 A | 4/1983 |
| JP | 2000-183382 A | 6/2000 |
| JP | 2008-205448 A | 9/2008 |
| JP | 2009-7524 A | 1/2009 |
| JP | 2010043156 A | 2/2010 |
| JP | 2010-153806 A | 7/2010 |
| JP | 2010168264 A | 8/2010 |
| JP | 2010-245391 A | 10/2010 |
| JP | 2011-32364 A | 2/2011 |

* cited by examiner

*Primary Examiner* — Roberto Rabago
(74) *Attorney, Agent, or Firm* — Sughrue Mion, PLLC

(57) ABSTRACT

The object of the present invention to provide a solar cell sealing film, which has superior durability that maintains adhesive performance for a long duration under the circumstances of a high temperature and high humidity, exerts high crosslink rate at production of the solar cells, and suppresses occurrence of blister, and a solar cell using the sealing film. The solar cell sealing film includes: ethylene-polar monomer copolymer, an organic peroxide, and a silane-coupling agent, wherein the silane-coupling agent is represented by formula (I):

[Formula 1]

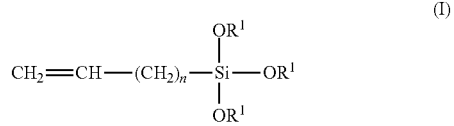

in which $R^1$ represents alkyl group having 1 to 3 carbon atoms, three $R^1$s are the same as or different from each other, and "n" is an integer of 1 to 8; and the silane-coupling agent is contained in the range of 0.02 to 1.0 parts by weight based on 100 parts by weight of the ethylene-polar monomer copolymer.

5 Claims, 1 Drawing Sheet

SOLAR CELL SEALING FILM AND SOLAR CELL USING THE SEALING FILM

CROSS REFERENCE TO RELATED APPLICATIONS

This is a National Stage of International Application No. PCT/JP2012/052673, filed Feb. 7, 2012, claiming priority from Japanese Patent Application No. 2011-035392, filed Feb. 22, 2011, the contents of all of which are incorporated herein by reference in their entirety.

TECHNICAL FIELD

The present invention relates to a solar cell sealing film comprising chiefly ethylene-polar monomer copolymer, particularly a solar cell sealing film, which has enhanced durability and superior productivity. Furthermore, it relates to a solar cell using the sealing film.

BACKGROUND ART

In recent year, a solar cell (solar cell module) has been widely employed as a device directly converting solar energy into electric energy from the viewpoints of the effective use of natural resources and prevention of environment pollution. Further development of solar cells is in progress.

As shown in FIG. 1, a solar cell generally includes a transparent front side protection material 11 (e.g., glass plate), a front side sealing film 13A, plural photovoltaic elements 14 (e.g., photovoltaic elements made of silicon), a backside sealing film 13B and a backside protection material 12 (backside covering member). For preparing a solar cell, first, the foregoing members are successively laminated in this order. Then, the laminated body is subjected to vacuum degassing, subsequently, heating under pressure for croslinking or curing a front side sealing film 13A and a backside sealing film 13B to adhesively combine the laminated body.

In order to generate a large electrical output, a solar cell has plural photovoltaic elements 14 connected with each other. Therefore, sealing films 13A, 13B having high insulation properties seal the photovoltaic elements for ensuring electrical insulation properties between the photovoltaic elements 14.

Furthermore, developments of thin-film solar cells, such as thin-film silicon type solar cell, an amorphous silicon film type solar cell and copper indium selenide (CIS) type solar cell are also developed. These thin-film solar cells are prepared by, for example, forming a thin-film photovoltaic element such as a semiconductor layer on surface of a transparent material such as a glass substrate and a polyimide substrate by chemical vapor deposition method or the like, superposing a sealing film on the thin-film photovoltaic element and adhesively combining them.

As a sealing film for the solar cells, a film made of ethylene-polar monomer copolymer such as ethylene-vinyl acetate copolymer (occasionally abbreviated to EVA) or ethylene-ethylacrylate copolymer (EEA) is used. Especially, the ethylene-vinyl acetate copolymer is preferably used because it has low cost and high transparency. Furthermore, in order to ensure mechanical durability of the solar cell, and prevent internal electrical leads and electrodes from rust caused by humidity or permeated water, it is required that an ethylene-polar monomer copolymer film used in sealing films is combined with a glass plate, photovoltaic elements and a backside covering member by high adhesive strength.

For this reason, in the conventional solar cell sealing film, the addition of organic peroxides as crosslinker to an ethylene-polar monomer copolymer gives crosslinked structure to improve weather resistance, and furthermore, the addition of silane-coupling agents to an ethylene-polar monomer copolymer brings about the improvement of adhesive strength (Patent Document 1).

Recently, a solar cell having a longer operating life has been required. Further, increasing use of a solar cell under unforgiving circumstances such as desert region or tropical area requires that a solar cell sealing film also has more enhanced durability and weather resistance, especially durability that maintains adhesive performance for a long duration under the circumstances of a high temperature and high humidity.

PRIOR ART DOCUMENTS

Patent Document

Patent Document 1: JP(TOKKAI) 2000-183382 A

SUMMARY OF THE INVENTION

Problem to be Solved by the Invention

However, the addition of silane-coupling agents for improving adhesive strength generally causes reduction in crosslink rate, and reduction in productivity of the solar cell sealing film. Recently, solar cells increase explosively in production, and therefore are focused on the productivity.

Though, a solar cell sealing film capable of high-speed production, which is called as "fast cure" has emerged, it is further required to produce more solar cells in a short time. On the other hand, increased additive amount of organic peroxides for increasing crosslink rate brings about blistering of film (hereinafter called as "blister") due to gas generation. Occurrence of blister damages a good appearance and decreases an insulation property and a moisture-proof property of the solar cells, to result in quality problem.

It is therefore an object of the present invention to provide a solar cell sealing film comprising chiefly ethylene-polar monomer copolymer and an organic peroxide for giving crosslinked structure, which has superior durability that maintains adhesive performance for a long duration under the circumstances of a high temperature and high humidity, exerts high crosslink rate on production of the solar cells, and suppresses occurrence of blister.

Furthermore, an object of the present invention is to provide a solar cell using the sealing film.

Means for Solving Problem

The above object is attained by a solar cell sealing film, comprising, ethylene-polar monomer copolymer, an organic peroxide, and a silane-coupling agent, wherein the silane-coupling agent is represented by formula (I):

[Formula 1]

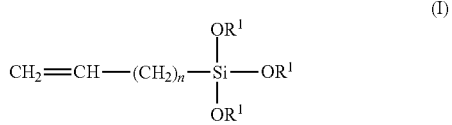

in which $R^1$ represents alkyl group having 1 to 3 carbon atoms, three R's are the same as or different from each other, and "n" is an integer of 1 to 8; and the silane-coupling agent is contained in the range of 0.02 to 1.0 parts by weight based on 100 parts by weight of the ethylene-polar monomer copolymer.

The sealing film has the superior durability that maintains adhesive performance for a long duration, the reason is considered as follows. In the case of adding a conventional silane-coupling agent such as γ-methacryloxypropyltrimethoxysilane, which has a methacryloxy group or an acryloxy group as a reactive functional group, to ethylene-polar monomer copolymer resin, the silane-coupling agent is combined with the resin via a COO-group. Under the circumstances of a high temperature and high humidity, the COO-group bond is apt to hydrolyze to deteriorate the adhesive property. In contrast, it is considered that the silane-coupling agent represented by formula (I) does not have a hydrolyzable functional group, and hence enables the adhesive property to maintain for a long duration. Further, a reason for high crosslink rate is considered as follows. In the case of adding a silane-coupling agent, which has a functional group having methyl group, such as a methacryloxy group, crosslinking reaction can be inhibited by steric hindrance. By contrast it is considered that the functional group of the silane-coupling agent represented by formula (I) has less effect of steric hindrance, whereby the silane-coupling agent less reduces crosslink rate. Therefore, there is no need to increase an additive amount of an organic peroxide, and it enables suppression of occurrence of blister.

Furthermore, in the case that there is no carbon atom between vinyl group ($CH_2$=CH—) and Si of a silane-coupling agent (that is, the "n" in the formula (I) is 0), the silane-coupling agent tends to scatter on the addition to ethylene-polar monomer copolymer resin because of its lower molecular weight, and occasionally bleeds out, the bleeding-out meaning additives leaching, after mixing the agent with other components.

Moreover, in the case of a silane-coupling agent in which the "n" in the formula (I) is 0, a distance between binding position with resin and adhesive interface is shorter than in the invention. Therefore, molecules of the silane-coupling agent are hard to become entangled with each other, whereby the agent may have an adverse effect on adhesive performance. In contrast, the silane-coupling agent of formula (I) (in which the "n" is an integer of 1 to 8) in the invention has a carbon chain having certain length between vinyl group ($CH_2$=CH—) and Si, and ensures an appropriate distance between binding position with resin and adhesive interface. Therefore, it is considered that molecules of the silane-coupling agent have torsion, or become strongly-entangled with each other, whereby the agent has an advantage in adhesive performance.

The use of the silane-coupling agent in too small amount gives less advantageous effect mentioned above, whereas the use of the silane-coupling agent in excessive amount occasionally brings about the difficulty in impregnating the polymer and the bleeding-out. Thus, the content of the silane-coupling agent is the range mentioned above.

Preferred embodiments of the solar cell sealing film according to the present invention are described as follows:

(1) The "n" in the formula (I) is an integer of 1 to 4. When the "n" is 5 or more, the molecular weight of the silane-coupling agent is higher, whereby compatibility of the silane-coupling agent with ethylene-polar monomer copolymer is apt to be decreased.

(2) The "n" in the formula (I) is 4. This material is preferred in terms of a good adhesive performance and compatibility with ethylene-polar monomer copolymer.

(3) The $R^1$ in the formula (I) is methyl group. Thereby the silane-coupling agent has high reactivity.

(4) The silane-coupling agent is contained in the range of 0.15 to 1.0 parts by weight based on 100 parts by weight of the ethylene-polar monomer copolymer. Thereby the durability that maintains adhesive performance for a long duration is more improved.

(5) The ethylene-polar monomer copolymer is ethylene-vinyl acetate copolymer.

Furthermore, the above object is attained by a solar cell obtained by use of the solar cell sealing film of the present invention.

Advantageous Effects of the Invention

The solar cell sealing film of the present invention, comprising chiefly ethylene-polar monomer copolymer, organic peroxides for giving crosslinked structure, and a specific silane-coupling agent for improving adhesive strength, is improved in durability that maintains adhesive performance for a long duration under the circumstances of a high temperature and high humidity. Further, the specific silane-coupling agent has less effect of steric hindrance, and thereby has less adverse effect on crosslink rate. Hence, the solar cell sealing film of the invention exerts high crosslink rate on production of the solar cells. As a result, there is no need to increase additive amount of organic peroxides, and it enables suppression of occurrence of blister, and prevent from damaging a good appearance.

Therefore, the use of the solar cell sealing film of the invention bring about a solar cell which is combined by high adhesive strength, and which has enhanced durability and high productivity, and suppresses damage of a good appearance due to occurrence of blister.

DESCRIPTION OF EMBODIMENTS

Figure 1:
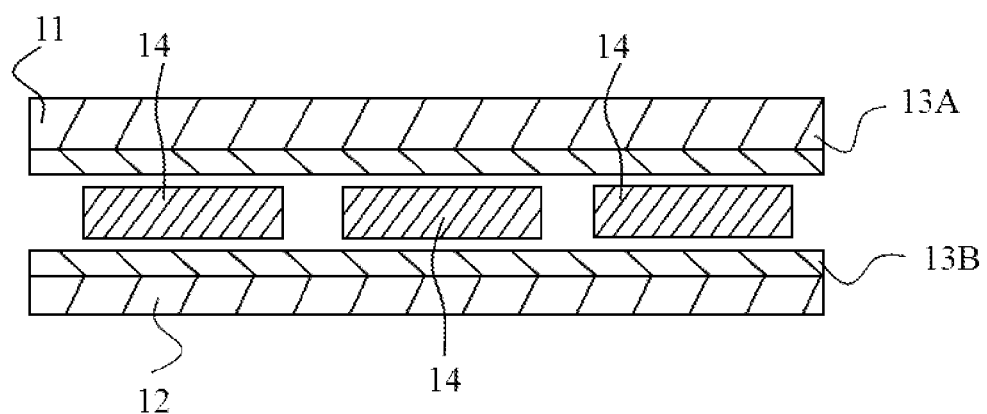
FIG. 1 is a schematic section view of a conventional solar cell.

A solar cell sealing film of the present invention comprises an ethylene-polar monomer copolymer, an organic peroxide as a crosslinker, and a silane-coupling agent represented by formula (I) as an adhesion improver.

[Formula 2]

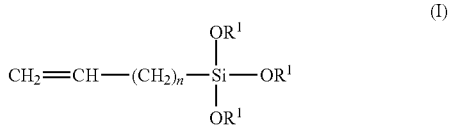

(I)

in which $R^1$ represents alkyl group having 1 to 3 carbon atoms, three R's are the same as or different from each other, and "n" is an integer of 1 to 8.

Furthermore, the silane-coupling agent is contained in the range of 0.02 to 1.0 parts by weight based on 100 parts by weight of the ethylene-polar monomer copolymer.

In the invention, the addition of the silane-coupling agent of the formula (I) makes it possible to improve durability that maintains adhesive performance for a long duration under the circumstances of a high temperature and high humidity, to exert high crosslink rate on production of the solar cell, and to suppress occurrence of blister. However, the use of the silane-coupling agent in too small amount gives less advantageous effect, whereas the use of the silane-coupling agent in excessive amount occasionally brings about the difficulty in impregnating the polymer and the bleeding-out. Thus, the content of the silane-coupling agent is the range mentioned above.

<Silane-Coupling Agent>

A silane-coupling agent binds to an organic material via a reactive functional group (e.g., $CH_2=CH-(CH_2)_n$ in the formula (I)), and further binds to a surface of an inorganic material through a reaction of hydrolyzed hydrolyzable groups (e.g., $OR^1$ in the formula (I)). Thereby a silane-coupling agent functions to combine strongly two or more materials having different chemical properties with each other.

The sealing film comprising the silane-coupling agent represented by the formula (I) has an improved durability that maintains adhesive performance for a long duration under the circumstances of a high temperature and high humidity, the reason is considered as follows. In the case of adding a conventional silane-coupling agent such as γ-methacryloxypropyltrimethoxysilane, which has a methacryloxy group or an acryloxy group as a reactive functional group, to ethylene-polar monomer copolymer resin, the silane-coupling agent is combined with the resin via a COO-group. Under the circumstances of a high temperature and high humidity, the COO-group bond is apt to hydrolyze to deteriorate the adhesive property. In contrast, it is considered that the silane-coupling agent represented by formula (I) does not have a hydrolyzable functional group and hence enables the adhesive property under the circumstances of a high temperature and high humidity to maintain for a long duration.

Further, a reason for high crosslink rate is considered as follows. In the case of adding a silane-coupling agent, which has a functional group having methyl group, such as a methacryloxy group, crosslinking reaction can be inhibited by steric hindrance. By contrast it is considered that the functional group of the silane-coupling agent represented by formula (I) has less effect of steric hindrance, whereby the silane-coupling agent less reduces crosslink rate. Therefore, there is no need to increase additive amount of an organic peroxide, and it enables suppression of occurrence of blister.

Furthermore, in the case that there is no carbon atom between vinyl group ($CH_2=CH-$) and Si of a silane-coupling agent (that is, the "n" in the formula (I) is 0), the silane-coupling agent tends to scatter on the addition to ethylene-polar monomer copolymer resin because of its lower molecular weight, and occasionally bleeds out, the bleeding-out meaning additives leaching, after mixing the agent with other components.

Moreover, in the case of a silane-coupling agent in which the "n" in the formula (I) is 0, a distance between binding position with resin and adhesive interface is shorter than in the invention. Therefore, molecules of the silane-coupling agent are hard to become entangled with each other, whereby the agent may have an adverse effect on adhesive performance. In contrast, the silane-coupling agent of formula (I) (in which the "n" is an integer of 1 to 8) in the invention has a carbon chain having certain length between vinyl group ($CH_2=CH-$) and Si, and ensures an appropriate distance between binding position with resin and adhesive interface. Therefore, it is considered that molecules of the silane-coupling agent have torsion, or become strongly-entangled with each other, whereby the agent has an advantage in adhesive performance.

The "n" in the formula (I) is preferably an integer of 1 to 4. When the "n" is 5 or more, the molecular weight of the silane-coupling agent is higher, whereby the compatibility of the silane-coupling agent with ethylene-polar monomer copolymer is apt to be decreased. The "n" in the formula (I) is especially 4 from viewpoint of both a good adhesive performance and compatibility with ethylene-polar monomer copolymer.

The $R^1$ is alkyl group having 1 to 3 carbon atoms, and examples of the $R^1$ include methyl group, ethyl group and isopropyl group. The $R^1$ in the formula (I) is preferably methyl group from viewpoint of high reactivity.

Examples of the silane-coupling agent represented by formula (I) include allyltrimethoxysilane, allyltriethoxysilane, allyltriisopropoxysilane, vinylethyltrimethoxysilane, vinylethyltriethoxysilane, vinylpropyltrimethoxysilane, vinylbutyltrimethoxysilane, vinylbutyltriethoxysilane vinylbutyltriisopropoxysilane, vinylpentyltrimethoxysilane, vinylhexyltri-methoxysilane, vinylheptyltrimethoxysilane and vinyloctyltrimethoxysilane. These silane-coupling agents can be employed singly or in combination of two or more kinds. The silane-coupling agents are more preferably allyltrimethoxysilane, allyltriethoxysilane, allyltriisopropoxysilane, vinylethyltrimethoxysilane, vinylethyltriethoxysilane, vinylpropyltrimethoxysilane, vinylbutyltrimethoxysilane, vinylbutyltriethoxysilane and vinylbutyltriisopropoxysilane. Particularly preferred is vinylbutyltrimethoxysilan.

The silane-coupring agent is contained in the range of 0.02 to 1.0 parts by weight based on 100 parts by weight of the ethylene-polar monomer copolymer as mentioned above. The silane-coupling agent is preferably contained in the range of 0.15 to 1.0 parts by weight, especially 0.3 to 1.0 parts by weight based on 100 parts by weight of the ethylene-polar monomer copolymer. As long as a content of the silane-coupling agent is the above mentioned range, the solar-cell shielding film having a more improved durability of adhesive performance can be obtained.

<Ethylene-Polar Monomer Copolymer>

In the invention, polar monomer of the ethylene-polar monomer copolymer is preferably unsaturated carboxylic acids, salts thereof, esters thereof and amides thereof, vinyl esters and carbon monoxide. Examples of the polar monomer include unsaturated carboxylic acids such as acrylic acid, methacrylic acid, fumaric acid, itaconic acid, monomethyl maleate, monoethyl maleate, maleic anhydride and itaconic anhydride, monovalent metal salts (e.g., lithium, sodium or potassium) of these unsaturated carboxylic acids, and multivalent metal salts (e.g., magnesium, calcium or zinc) of these unsaturated carboxylic acids; unsaturated carboxylic acid esters such as methyl acrylate, ethyl acrylate, isopropyl acrylate, isobutyl acrylate, n-butyl acrylate, isooctyl acrylate, methyl methacrylate, ethyl methacrylate, isobutyl methacrylate and dimethyl maleate; vinyl esters such as vinyl acetate and vinyl propionate; carbon monoxide; and sulfur dioxide. The monomers can be used singly or in combination of two or more kinds.

Examples of the ethylene-polar monomer copolymer include ethylene-unsaturated carboxylic acid copolymers such as ethylene-acrylic acid copolymer and ethylene-methacrylic acid copolymer; ionomers obtained by neutralizing a part or whole of carboxylic acids of ethylene-unsaturated carboxylic acids copolymer by the above-mentioned metals; ethylene-unsaturated carboxylic acid ester copolymers such as ethylene-methyl acrylate copolymer, ethylene-ethyl acrylate copolymer, ethylene-methyl methacrylate copolymer, ethylene-isobutyl acrylate copolymer and ethylene-n-butyl acrylate copolymer; ethylene-unsaturated carboxylic acid ester-unsaturated carboxylic acid copolymers such as ethylene-isobutyl acrylate-methacrylic acid copolymer, ethylene-n-butyl acrylate-methacrylic acid copolymer; ionomers obtained by neutralizing a part or whole of carboxylic acids of ethylene-unsaturated carboxylic acid ester-unsaturated carboxylic acid copolymers by the above-mentioned metals; and ethylene-vinyl ester copolymer such as ethylene-vinyl acetate copolymer.

The ethylene-polar monomer copolymer used in the invention preferably has Melt Flow Rate (according to JIS K 7210) of 35 g/10 min or less, especially 3 to 6 g/10 min. Use of the ethylene-polar monomer copolymer having Melt Flow Rate of the above-mentioned range enables to repress the phenomenon that the sealing film melts and go off the defined location to protrude outside the substrate when the film is heated under pressure in a sealing step for preparation of solar cell.

A value of Melt Flow Rate (MFR) is determined under the conditions of temperature of 190° C. and load of 21.18N according to JIS K 7210.

The ethylene-polar monomer copolymer is most preferably ethylene-vinyl acetate copolymer (EVA), whereby a solar cell sealing film having low cost and excellent transparency and flexibility can be obtained.

In the EVA, the content of vinyl acetate recurring unit generally is in the range of 20 to 35% by weight, preferably 22 to 30% by weight, especially 24 to 28% by weight based on 100 parts by weight of EVA. The less content of vinyl acetate, the harder EVA composition is obtained. When the content is less than 20% by weight, the sealing film crosslinked and cured at high temperature does not occasionally show sufficiently high transparency. On the other hand, when the content is more than 35% by weight, the sealing film is apt to have insufficient hardness, furthermore to form carboxylic acid, alcohol or amine to generate bubbles at the interface between the sealing film and the protective material.

The solar cell sealing film of the invention may collaterally contain polyvinyl acetal resin (e.g., polyvinyl formal, polyvinyl butyral (PVB resin), modified PVB) or vinyl chloride resin, in addition to ethylene-polar monomer copolymer. In that case PVB is particularly preferred.

<Organic Peroxide>

The use of the organic peroxide as crosslinker enables the crosslink of ethylene-polar monomer copolymer. Therefore, it is possible to obtain a solar cell sealing film having improved adhesive strength, transparency, humidity resistance and penetration resistance.

Any organic peroxides that can be decomposed at a temperature of not less than 100° C. to generate radical(s) can be employed as the above-mentioned organic peroxide. The organic peroxide is generally selected in the consideration of film-forming temperature, conditions for preparing the composition, curing (bonding) temperature, heat resistance of body to be bonded, storage stability. In particular, it is preferable to use a material having a decomposition temperature of not less than 70° C. in a half-life of 10 hours.

From the viewpoint of resin processing temperature and storage stability, examples of the organic peroxides include 2,5-dimethylhexane-2,5-dihydroperoxide, 2,5-dimethyl-2,5-di(tert-butylperoxy)hexane, 3-di-tert-butylperoxide, di-cumyl peroxide, 2,5-dimethyl-2,5-di(2-ethylhaxanoylperoxy)hexane, 2,5-dimethyl-2,5-di(tert-butylperoxy)hexyne, tert-butylcumylperoxide, α,α'-bis(tert-butylperoxyisopropyl)benzene, tert-butylperoxy-2-ethylhexyl monocarbonate, a, a'-bis(tert-butylperoxy)diisopropylbenzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoyl peroxide, 1,1-di(tert-hexylperoxy)-3,3,5-trimethylcyclohexane.

As the organic peroxide, it is particularly preferable to use 2,5-dimethyl-2,5-di(2-ethylhexanoylperoxy)hexane, tert-butylperoxy-2-ethylhexyl monocarbonate, and 1,1-di(tert-hexylperoxy)-3,3,5-trimethylcyclohexane.

The content of the organic peroxide in the sealing film is preferably in the range of 0.1 to 5 parts by weight, more preferably in the range of 0.2 to 1.8 parts by weight, much more preferably in the range of 0.5 to 1.5 parts by weight based on 100 parts by weight of ethylene-polar monomer copolymer.

<Crosslinking Auxiliary Agent>

The solar cell sealing film of the present invention may contain crosslinking auxiliary agent if necessary. The crosslinking auxiliary agent enables increase of gel fraction of ethylene-polar monomer copolymer and improvement of adhesive property and durability of the sealing film.

The crosslinking auxiliary agent is generally used in an amount of 10 parts by weight or less, preferably in the range of 0.1 to 5.0 parts by weight, based on 100 parts by weight of ethylene-polar monomer copolymer. Accordingly, a sealing film having an excellent adhesive property can be obtained.

Examples of the crosslinking auxiliary agents (compounds having a radical polymerizable group as functional group) include tri-functional crosslinking auxiliary agents such as triallyl cyanurate and triallyl isocyanurate, mono- or di-functional crosslinking auxiliary agents of (meth)acryl esters (e.g., NK Ester, etc.). Among these compounds, triallyl cyanurate and triallyl isocyanurate are preferred, and triallyl isocyanurate is particularly preferred.

<Others>

The solar cell sealing film of the invention may further contain various additives such as plasticizer, acryloxy group-containing compound, methacryloxy group-containing compounds and/or epoxy group-containing compounds for improvement or adjustment of various properties of the film (e.g., mechanical strength, adhesion property, optical characteristics such as transparency, heat-resistance, light-resistance, or crosslinking rate, etc.), in particular, for improvement of mechanical strength of the film if necessary.

Generally speaking, polybasic acid esters and polyhydric alcohol esters can be used as the above-mentioned plasticizer, although there are not particular restrictions to plasticizer to be used. Examples of the plasticizers include dioctyl phthalate, dihexyl adipate, triethylene glycol-di-2-ethylbutyrate, butyl sebacate, tetraethylene glycol diheptanoate and triethylene glycol dipelargonate. The plasticizers can be used singly, or in combination of two or more kinds. The content of the plasticizer preferably is not more than 5 parts by weight based on 100 parts by weight of ethylene-polar monomer copolymer.

Generally speaking, derivatives of acrylic acid or methacrylic acid, such as esters and amides of acrylic acid or methacrylic acid can be used as the above-mentioned acryloxy group-containing compound and methacryloxy group-containing compound. Examples of the ester residue include linear alkyl groups (e.g., methyl, ethyl, dodecyl, stearyl and lauryl), cyclohexyl group, tetrahydrofurfuryl group, aminoethyl group, 2-hydroxyethyl group, 3-hydroxypropyl group, 3-chloro-2-hydroxypropyl group. Example of the amide includes diacetone acryl amide. Further, the esters include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group-containing compounds include tri-glycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The content of the acryloxy group-containing compound, methacryloxy group-containing compound or epoxy group containing compound is generally in the range of 0.5 to 5.0 parts by weight, particularly preferably 1.0 to 4.0 parts by weight based on 100 parts by weight of ethylene-polar monomer copolymer.

Further, the solar cell sealing film of the invention may further contain ultraviolet absorbent, light stabilizer, and/or antioxidant.

By adding the ultraviolet absorbent to the sealing film, it is possible to prevent the ethylene-polar monomer copolymer from deteriorating due to light irradiation or the like, and the solar cell sealing film from yellowing.

There is no particular restriction to ultraviolet absorbent to be used in the invention. Preferable examples of the ultraviolet absorbent are benzophenone-type ultraviolet absorbents such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone and 2-hydroxy-4-n-octoxybenzophenone. Moreover, the content of the benzophenone-type ultraviolet absorbent is preferably in the range of 0.01 to 5 parts by weight based on 100 parts by weight of ethylene-polar monomer copolymer.

It is also possible, by adding the light stabilizer to the sealing film, to prevent the ethylene-polar monomer copolymer from deteriorating due to light irradiation or the like, and the solar cell sealing film from yellowing. A hindered amine light stabilizer can be used as the light stabilizer. Ex-ampler of the light stabilizers include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD, and CHIMASSORB 944LD (each manufactured by Ciba Specialty Chemicals Co., Ltd.), and UV-3034 (each manufactured by B. F. Goodrich). The light stabilizers can be each used singly, or in combination of two or more kinds. The content of the light stabilizer is preferably in the range of 0.01 to 5 parts by weight based on 100 parts by weight of ethylene-polar monomer copolymer.

Examples of the antioxidants include hindered phenol-type antioxidants such as N,N'-hexan-1,6-diyl-bis[3-(3,5-di-tert-butyl-4-hydroxyphenyl) propionamide], phosphorus-type heat stabilizers, lactone-type heat stabilizers, vitamin E-type heat stabilizers and sulfur-type heat stabilizers.

The solar cell sealing film of the invention can be prepared in accordance with heretofore known processes.

For example, the composition including the above mentioned materials is mixed by a common process using a supermixer (high speed fluidizing mixer) or a roll mill, subsequently formed into a sheet-shaped article by extrusion molding or calender molding (calendering). Otherwise, the composition is dissolved in a solvent, the thus obtained solution is applied to an appropriate support by an appropriate coater, and then the applied solution is dried to form a coated film. Thus, a sheet-shaped article can be prepared. Additionally, the heating temperature at the film-formation is preferably a temperature that the crosslinker cause no reaction or little reactions. For instance, the heating temperature is preferably in the range of 50 to 90° C., particularly in the range of 50 to 80° C. The solar cell sealing film of the invention does not have any particular restriction on the thickness, which is generally in the range of 50 μm to 2 mm.

[Solar Cell]

The structure of the solar cell of the invention is not particularly restricted, as long as the solar cell sealing film of the invention is used. Examples of the structure include a structure that photovoltaic elements are sealed through the solar cell sealing films between a transparent front side protection material and a backside protection material. In the invention, "front side" corresponds to a side of the photovoltaic element irradiated with the light (light-receiving side), whereas "backside" corresponds to the reverse side of the light-receiving side of the photovoltaic elements.

For sufficiently sealing the photovoltaic elements in the solar cell, for instance, a transparent front side protection material 11, a front side sealing film 13A, photovoltaic elements 14, a backside sealing film 13B and a backside protection material 12 can be laminated in this order, as shown in FIG. 1. Thereafter, the sealing film can be crosslinked or cured according to a conventional process such as the application of heating and pressure.

For example, the laminated body can be bonded under the application of heating and pressure by using a vacuum laminator in the conditions of temperature of 135 to 180° C., preferably 140 to 180° C., especially 155 to 180° C., degassing time period of 0.1 to 5 min, pressing pressure of 0.1 to 1.5 kg/cm$^2$ and pressing time period of 5 to 15 min. This heating and pressure enables the crosslinking of the ethylene-polar monomer copolymer contained in the front side sealing film 13A and the backside sealing film 13B, whereby the transparent front side protection material 11, the backside protection material 12 and the photovoltaic elements 14 are combined through the front side sealing film 13A and the backside sealing film 13B, which results in seal of the photovoltaic elements 14.

In addition, the solar cell sealing film of the invention can be used for not only a solar cell using single-crystalline or polycrystalline silicone crystal type photovoltaic elements as shown in FIG. 1, but also thin-film solar cells, such as thin-film silicon type solar cell, an amorphous silicon film type solar cell and copper indium selenide (CIS) type solar cell. Examples of a structure of thin-film solar cell include;

a structure that on a thin-film photovoltaic element formed on surface of a transparent front side protection material such as a glass substrate, a polyimide substrate and a fluorine resin type transparent substrate by chemical vapor deposition method, etc., the solar cell sealing film of the invention and a backside protection material are superposed and adhesively combined, a structure that on a thin-film photovoltaic element formed on a surface of a backside protection material, the solar cell sealing film of the invention and a transparent front side protection material are superposed and adhesively combined, and a structure that a transparent front side protection material, a front side solar cell sealing film, a thin-film photovoltaic element, a backside solar cell sealing film and a backside protection material are laminated in this order, and adhesively combined.

The solar cell sealing film of the invention is improved in durability that maintains adhesive performance for a long duration under the circumstances of a high temperature and high humidity, and exerts high crosslink rate on production of the solar cells, and further suppresses occurrence of blister. Therefore, a solar cell which is improved in durability under the circumstances of high temperature and high humidity, and high productivity, and suppresses damage of a good appearance due to occurrence of blister can be obtained.

The transparent front side protection material 11 used in the solar cell of the invention is preferably a glass substrate such as silicate glass. The thickness of the glass substrate is generally in the range of 0.1 to 10 mm, preferably 0.3 to 5 mm. The glass substrate can be chemically or thermally tempered.

The backside protection material 12 for use in the invention is preferably a plastic film such as polyethylene terephthalate (PET). From the viewpoint of heat resistance and moisture resistance, a fluorinated polyethylene film or especially a film having structure of fluorinated polyethylene film/Al/fluorinated polyethylene film laminated in this order is preferred. A plastic film such as PET generally shows poor adhesion to a solar cell sealing film. Therefore, the solar cell sealing film of the invention having good adhesion is preferably used in a solar cell having a plastic film such as PET as a back side protection material.

The solar cell (including thin-film solar cell) of the invention is characterized by the specific sealing films used as the front side and/or the backside sealing film. Therefore, there is no particular restriction on the materials of the solar cell except for the sealing films (i.e., transparent front side protection material, backside protection material, photovoltaic elements, etc.). Those materials can have the same structures/compositions as those in heretofore known solar cells.

EXAMPLES

The invention is illustrated in detail using the following Examples.

Examples 1

Materials with the formulation in Table 1 were supplied to a roll mill, and kneaded at 70° C. to prepare a composition for a solar cell sealing film. The composition for a sealing film was formed by calendering at temperature of 70° C. After the formed composition was allowed to cool, a solar cell sealing film (thickness: 0.6 mm) was prepared.

Examples 2 to 14 and Comparative Examples 1 to 21

Compositions for solar cell sealing films were prepared in the same way as in Example 1, except that the materials and formulations are changed into those in Tables 1 to 3. By using these compositions, solar cell sealing films were prepared.

[Evaluation Methods]

(1) Crosslink Rate

The solar cell sealing film prepared above was heated at 155° C. in an oven to be subjected to crosslinking reaction. An approximately 1 g of the sealing film was precisely collected as a sample at regular time intervals during reaction. The sample was subjected to an extraction treatment by heated xylene in Soxhlet extractor for 6 hours. Subsequently, the resultant gel component was dried at 80° C. for 12 hours or more, and precisely weighed. After that, a weight percent of the gel component based on a weight of the sample of the sealing film was calculated. A crosslink rate is defined as a crosslink time when the weight percent of the gel component reach 80%. A crosslink rate of up to 10 minutes is set as the acceptable level.

(2) Glass Adhesive Strength (i) Initial Glass Adhesive Strength

Figure 2:
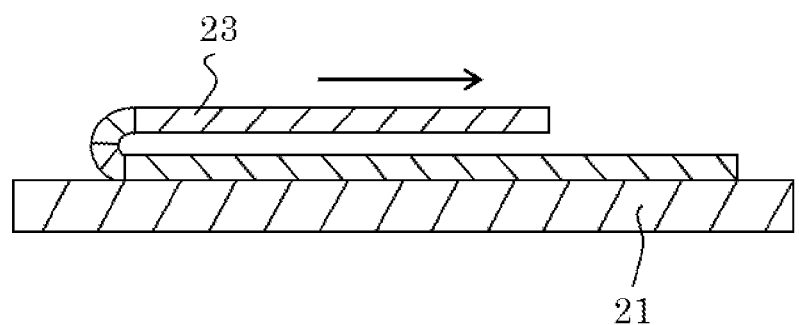
FIG. 2 is a schematic diagram for explaining 180° peel test.

The adhesive strengths of the sealing films were evaluated according to 180° peel test (JIS K 6584, 1994). 180° peel test was carried out in the following procedures as shown in FIG. 2.

A glass substrate 21 (float glass: thickness; 3 mm), the solar cell sealing film 23 were laminated. The obtained laminate was subjected to vacuum degassing by using a vacuum laminator and preliminary pressure contact treatment at a temperature of 100° C., for 10 minutes. Subsequently, the laminate was brought into an oven, and treated by application of pressure and heat at a temperature of 155° C., for 45 minutes. Thereafter, the laminate was left in an atmosphere of 23° C. and 50% RH for 24 hours. Then, the sealing film 23 was partially released from the glass substrate 21. The released part of the sealing film 23 was folded by 180° turn. By using a tensile tester (Autograph, manufactured by Shimadzu Co., LTD), peal strength at a tensile speed of 100 mm/min was measured, as glass adhesive strength (N/cm).

(Ii) Glass Adhesive Strength after Heat and Humidity Treatment

The laminate prepared above was left in an oven at temperature of 85° C. and humidity of 85% RH for 5000 hours. Thereafter glass adhesive strength (N/cm) of the laminate was measured in the same manner as (i).

(3) Blister Property (Blistering of Film by Gas Generation)

A glass substrate, the solar cell sealing film, a photovoltaic element, the solar cell sealing film and a gas barrier layer (Tedlar® (polyethylene fluoride film (manufactured by DuPont)/aluminum foil/Tedlar®) were laminated in this order. The resultant laminate was subjected to vacuum disgassing by using a vacuum laminator. Subsequently, the laminate was heated at 155° C. in an oven. Then, a time until blistering of the film occurs by gas generation was measured as blister property. Blister property of 45 minutes or more is set as the acceptable level.

(4) Bleeding-Out

The laminate sample left in an oven at temperature of 85° C. and humidity of 85% RH for 5000 hours as mentioned in (2)(ii) was evaluated, regarding bleeding-out which means additives leaching as follows.

○: occurrence of bleeding-out was not observed.

x: occurrence of bleeding-out was observed.

[Evaluation Result]

The results are shown in Tables 1 to 3.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 |
|---|---|---|---|---|---|---|---|---|---|---|---|---|---|---|---|
| Formulation (part by weight) | EVA*1 | 100 | 100 | 100 | 100 | 100 | 100 | 100 | 100 | 100 | 100 | 100 | 100 | 100 | 100 |
| | Organic peroxside*2 | 1.4 | 1.4 | 1.4 | 1.4 | 1.4 | 1.4 | 1.4 | 1.4 | 1.4 | 1.4 | 1.4 | 1.4 | 1.4 | 1.4 |
| | Crosslinking auxiliary agent*3 | 1.9 | 1.9 | 1.9 | 1.9 | 1.9 | 1.9 | 1.9 | 1.9 | 1.9 | 1.9 | 1.9 | 1.9 | 1.9 | 1.9 |
| | Silane-coupling agent(1)*4 | 0.03 | 0.1 | 0.15 | 0.3 | 0.65 | 0.85 | 1.0 | — | — | — | — | — | — | — |
| | Silane-coupling agent(2)*5 | — | — | — | — | — | — | — | 0.03 | 0.1 | 0.15 | 0.3 | 0.65 | 0.85 | 1.0 |

TABLE 1-continued

|  |  | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 |
|---|---|---|---|---|---|---|---|---|---|---|---|---|---|---|---|
| Evaluation result | Crosslink rate (min.) | 8.5 | 8.6 | 8.6 | 8.6 | 8.5 | 8.5 | 8.5 | 8.7 | 8.7 | 8.7 | 8.6 | 8.7 | 8.7 | 8.7 |
|  | Initial glass adhesive strength (N/cm) | 19.0 | 19.5 | 21.0 | 21.2 | 20.4 | 20.8 | 20.9 | 17.8 | 18.0 | 17.7 | 17.6 | 18.6 | 18.6 | 18.5 |
|  | Glass adhesive strength after heat and humidity treatment (N/cm) | 16.6 | 17.5 | 20.1 | 22.2 | 21.3 | 20.1 | 20.2 | 12.0 | 13.5 | 14.0 | 14.1 | 15.5 | 15.6 | 15.5 |
|  | Blister property (min.) | 90 | 90 | 90 | 90 | 90 | 90 | 90 | 90 | 90 | 90 | 90 | 90 | 90 | 90 |
|  | Bleeding-out | ○ | ○ | ○ | ○ | ○ | ○ | ○ | ○ | ○ | ○ | ○ | ○ | ○ | ○ |

Note)
[*1] Ultrasen 634 (manufactured by Tosoh Co., Ltd.) (the content of vinyl acetate in EVA is 26% by weight).
[*2] 2,5-dimethyl-2,5-di(2-ethylhexanoylperoxy)hexane.
[*3] triarllyl isocyanurate.
[*4] allyltrimethoxysilane (Z-6825 (manufactured by Dow Corning Toray Co., Ltd.)).
[*5] vinylbutyltrimethoxysilane.

TABLE 2

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|---|---|
| Formulation (part by weight) | EVA[*1] | 100 | 100 | 100 | 100 | 100 | 100 | 100 | 100 | 100 | 100 | 100 |
|  | Organic peroxside[*2] | 1.4 | 1.4 | 1.4 | 1.4 | 1.4 | 1.4 | 1.4 | 1.4 | 1.4 | 1.7 | 1.9 |
|  | Crosslinking auxiliary agent[*3] | 1.9 | 1.9 | 1.9 | 1.9 | 1.9 | 1.9 | 1.9 | 1.9 | 1.9 | 2.0 | 2.0 |
|  | Silane-coupling agent(1)[*4] | 0.01 | 1.1 | — | — | — | — | — | — | — | — | — |
|  | Silane-coupling agent(2)[*5] | — | — | 0.01 | 1.0 | — | — | — | — | — | — | — |
|  | Silane-coupling agent(3)[*6] | — | — | — | — | 0.1 | 0.15 | 0.3 | 0.65 | 0.85 | 0.3 | 0.3 |
| Evaluation result | Crosslink rate (min.) | 8.6 | 8.5 | 8.4 | 8.4 | 11.5 | 12.1 | 12.5 | 14.8 | 16.3 | 9.1 | 8.8 |
|  | Initial glass adhesive strength (N/cm) | 19.4 | 19.5 | 18.8 | 19.4 | 18.1 | 17.9 | 19.2 | 19.5 | 20.5 | 17.6 | 16.5 |
|  | Glass adhesive strength after heat and humidity treatment (N/cm) | 3.5 | 16.3 | 1.1 | 16.1 | 4.1 | 5.5 | 7.1 | 15.5 | 17.1 | 6.1 | 5.8 |
|  | Blister property (min.) | 90 | 90 | 90 | 90 | 90 | 90 | 90 | 90 | 90 | 40 | 25 |
|  | Bleeding-out | ○ | X | ○ | X | ○ | ○ | ○ | ○ | ○ | ○ | ○ |

Note)
[*1]-[*5] as described in Table 1.
[*6] 3-methacryloxypropyltrimethoxysilane (Z-6030 (manufactured by Dow Corning Toray Co., Ltd.)).

TABLE 3

|  |  | Comp. Ex. 12 | Comp. Ex. 13 | Comp. Ex. 14 | Comp. Ex. 15 | Comp. Ex. 16 | Comp. Ex. 17 | Comp. Ex. 18 | Comp. Ex. 19 | Comp. Ex. 20 | Comp. Ex. 21 |
|---|---|---|---|---|---|---|---|---|---|---|---|
| Formulation (part by weight) | EVA[*1] | 100 | 100 | 100 | 100 | 100 | 100 | 100 | 100 | 100 | 100 |
|  | Organic peroxside[*2] | 1.4 | 1.4 | 1.4 | 1.4 | 1.4 | 1.4 | 1.4 | 1.4 | 1.4 | 1.4 |
|  | Crosslinking auxiliary agent[*3] | 1.9 | 1.9 | 1.9 | 1.9 | 1.9 | 1.9 | 1.9 | 1.9 | 1.9 | 1.9 |
|  | Silane-coupling agent(4)[*7] | 0.3 | 0.65 | — | — | — | — | — | — | — | — |
|  | Silane-coupling agent(5)[*8] | — | — | 0.3 | 0.65 | — | — | — | — | — | — |
|  | Silane-coupling agent(6)[*9] | — | — | — | — | 0.3 | 0.65 | — | — | — | — |
|  | Silane-coupling agent(7)[*10] | — | — | — | — | — | — | 0.3 | 0.65 | — | — |
|  | Silane-coupling agent(8)[*11] | — | — | — | — | — | — | — | — | 0.3 | 0.65 |
| Evaluation result | Crosslink rate (min.) | 12.1 | 14.1 | 12.1 | 15.1 | 8.7 | 8.6 | 8.7 | 8.8 | 8.8 | 8.7 |
|  | Initial glass adhesive strength (N/cm) | 19.1 | 18.8 | 18.7 | 18.6 | 18.4 | 18.8 | 18.8 | 19.0 | 19.0 | 18.4 |
|  | Glass adhesive strength after heat and humidity treatment (N/cm) | 5.1 | 8.8 | 6.6 | 6.9 | 13.3 | 14.1 | 10.1 | 11.1 | 13.3 | 13.1 |

TABLE 3-continued

|  | Comp. Ex. 12 | Comp. Ex. 13 | Comp. Ex. 14 | Comp. Ex. 15 | Comp. Ex. 16 | Comp. Ex. 17 | Comp. Ex. 18 | Comp. Ex. 19 | Comp. Ex. 20 | Comp. Ex. 21 |
|---|---|---|---|---|---|---|---|---|---|---|
| Blister property (min.) | 90 | 90 | 90 | 90 | 90 | 90 | 90 | 90 | 90 | 90 |
| Bleeding-out | ◯ | ◯ | ◯ | ◯ | X | X | ◯ | ◯ | ◯ | ◯ |

Note)
*[1]-*[3] as described in Table 1.
*[7] 3-methacryloxypropylmethyldimethoxysilane (Z-6033 (manufactured by Dow Corning Toray Co., Ltd.)).
*[8] 3-methacryloxypropyltriethoxysilane (Z-6036 (manufactured by Dow Corning Toray Co., Ltd.)).
*[9] vinyltrimethoxysilane (Z-6300 (manufactured by Dow Corning Toray Co., Ltd.)).
*[10] vinyltriethoxysilane (Z-6519 (manufactured by Dow Corning Toray Co., Ltd.)).
*[11] vinyltriisopropoxysilane (Z-6550 (manufactured by Dow Corning Toray Co., Ltd.)).

According to Examples 1 to 14, the solar cell sealing films comprising a silane-coupling agent represented by the formula (I) (silane-coupling agent (1) or (2)) in the amount of 0.03 to 1.0 parts by weight based on 100 parts by weight of EVA show high crosslink rate. Therefore, there is no need to add a large amount of organic peroxide as crosslinker, and it enables suppression of occurrence of blister in the examples. Further, the sealing films of the examples show high adhesive strength after heat and humidity treatment, and therefore sufficiently maintain adhesive performance.

In Comparative Examples 1 to 4, the solar cell sealing films comprising a silane-coupling agent of the formula (I) in the amount of 0.01 parts by weight based on 100 parts by weight of EVA do not sufficiently maintain adhesive performance, whereas the sealing films comprising the silane-coupling agent in the amount of 1.0 part by weight show occurrence of bleeding-out.

On the other hand, in Comparative Examples 5 to 15, the solar cell sealing films using a silane-coupling agent having a methacryloxy group as a reactive functional group show low crosslink rate, the silane-coupling agent being selected from silane-coupling agents other than the formula (I). Further adhesive strength after heat and humidity treatment is reduced, and therefore, the sealing films do not sufficiently maintain adhesive performance. Furthermore, the films of Comparative Examples 10 and 11 comprising the organic peroxide in larger amount than other in order to increase crosslink rate show poor the blister property. Moreover, the films of Comparative Examples 16 to 21 using a silane-coupling agent in which the "n" in the formula (I) is 0 show low adhesive strength of the sealing films after heat and humidity treatment, and therefore, the sealing films do not sufficiently maintain adhesive performance. Further, the films of Comparative Examples 16 and 17 using silane-coupling agent (6) which has the lowest molecule weight show occurrence of bleeding-out.

Thus, the above mentioned results show that a solar cell sealing film which has superior durability that maintains adhesive performance for a long duration under the circumstances of a high temperature and high humidity, and exerts high crosslink rate can be obtained by the invention. The present invention is not restricted to the embodiments and Examples as mentioned above and therefore can be varied widely within the gist of the invention.

DESCRIPTION OF THE REFERENCE NUMBERS

11: transparent front side protection material
12: backside protection material
13A: front side sealing film
13B: backside sealing film
14: photovoltaic element
21: glass substrate
23: solar cell sealing film

The invention claimed is:

1. A solar cell sealing film, comprising:
ethylene-polar monomer copolymer,
an organic peroxide, and
a silane-coupling agent,
wherein the silane-coupling agent is represented by formula (I):

[Formula 1]

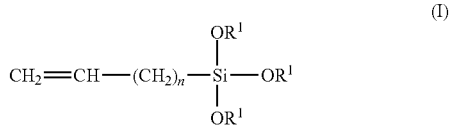

in which $R^1$ represents alkyl group having 1 to 3 carbon atoms, three $R^1$s are the same as or different from each other, and "n" is 4; and
the silane-coupling agent is contained in the range of 0.02 to 1.0 parts by weight based on 100 parts by weight of the ethylene-polar monomer copolymer.

2. The solar cell sealing film as defined in claim 1, wherein the $R^1$ in the formula (I) is methyl group.

3. The solar cell sealing film as defined in claim 1, wherein the silane-coupling agent is contained in the range of 0.15 to 1.0 parts by weight based on 100 parts by weight of the ethylene-polar monomer copolymer.

4. The solar cell sealing film as defined in claim 1, wherein the ethylene-polar monomer copolymer is ethylene-vinyl acetate copolymer.

5. A solar cell comprising a sealing film obtained by crosslinking or curing of a solar cell sealing film as defined in claim 1.

* * * * *